United States Patent [19]
Weisfield

[11] Patent Number: 5,770,871
[45] Date of Patent: Jun. 23, 1998

[54] SENSOR ARRAY WITH ANTICOUPLING LAYER BETWEEN DATA LINES AND CHARGE COLLECTION ELECTRODES

[75] Inventor: Richard L. Weisfield, Los Altos, Calif.

[73] Assignee: Xerox Corporation, Stamford, Conn.

[21] Appl. No.: 667,198

[22] Filed: Jun. 20, 1996

[51] Int. Cl.$^6$ ............................................... H01L 31/00
[52] U.S. Cl. .......................... 257/232; 257/233; 257/291; 257/292; 257/446; 257/448
[58] Field of Search ................................. 257/448, 446, 257/443, 232, 233, 292, 291

[56] References Cited

U.S. PATENT DOCUMENTS

| | | | |
|---|---|---|---|
| 5,557,534 | 9/1996 | Wu | 364/491 |
| 5,600,155 | 2/1997 | Wu | 257/72 |
| 5,610,404 | 3/1997 | Possin | 250/370.09 |

*Primary Examiner*—William Mintel

[57] ABSTRACT

A sensor array has cells, each with a sensing element and a switching element. The sensing element includes a charge collection electrode. An anticoupling layer between the charge collection electrodes and the data lines is structured to reduce capacitive coupling between the electrodes and the data lines below a threshold level at which crosstalk is unacceptable. If charge collection electrodes overlap data lines, the anticoupling layer can reduce capacitive coupling so that crosstalk is no greater than 2%. The anticoupling layer can be a dielectric layer with dielectric constant less than 6 and with thickness greater than 1.5 μm, with the dielectric constant being sufficiently low and the thickness sufficiently great that the anticoupling layer reduces capacitive coupling below the threshold level. Or the anticoupling layer can include a fixed potential sublayer of conductive material, electrically connected to circuitry that holds it at a fixed potential; the fixed potential sublayer therefore reduces capacitive coupling below the threshold level.

17 Claims, 6 Drawing Sheets

SENSOR ARRAY WITH ANTICOUPLING LAYER BETWEEN DATA LINES AND CHARGE COLLECTION ELECTRODES

BACKGROUND OF THE INVENTION

Related U.S. patent application Ser. Nos. 08/483,406, entitled "Improved Solid State Sensor" and 08/474,845, entitled "Array Circuitry with Conductive Lines, Contact Leads, and Storage Capacitor Electrode All Formed in Layer that Includes Highly Conductive Metal" are both incorporated herein by reference in their entireties.

The present invention relates to sensor arrays. More specifically, the invention relates to techniques for reducing crosstalk.

Lee, D. L., Cheung, L. K., and Jeromin, L. S., "A New Digital Detector for Projection Radiography," *SPIE*, Vol. 2432, No. 237, 1995, describes a digital radiographic system. Section 3, beginning on page 239, describe a multi-layer structured detector, illustrated in FIGS. 2–5. FIG. 2 shows a top electrode, described on page 240 as a thin layer of metal deposited on a dielectric material and that completes the multi-layer structure. Each pixel consists of a storage capacitor, charge collection electrode, and an amorphous silicon field-effect-transistor (FET). The gate of each FET is connected to one of a set of gate lines, and the source to one of a set of data lines. FIG. 4 shows a cross-sectional view of a pixel with a "mushroom" charge collection electrode design. As shown, the pixel pitch is 139 $\mu$m×139 $\mu$m, while the mushroom electrode is 129 $\mu$m×129 $\mu$m. The mushroom electrode covers 86% of the total pixel area.

SUMMARY OF THE INVENTION

The invention is based on the recognition of a basic problem that arises in sensor arrays, especially when conductive charge collection electrodes overlap lines carrying signals from cells of the array to the array's periphery, referred to herein as "data lines." During readout of stored charge, a data line is electrically connected to one charge collection electrode at a time. Capacitive coupling between the data line and charge collection electrodes can result in readout errors, especially if the charge collection electrodes overlap the data line.

For example, capacitive coupling results in "crosstalk," an error offset that results from induced charge on a data line, especially from charge collection electrodes capacitively coupled to the data line but possibly also from other capacitively coupled components. Crosstalk modifies the charge that is read from the data line. Crosstalk can also modify the charge stored on capacitively coupled electrodes, resulting in an error when the stored charge is read out. Therefore, crosstalk degrades an image obtained from the array.

When crosstalk occurs, the charge on a data line after it is electrically connected, through switching, to a charge collection electrode will be a summation of charges. The summation includes not only the charge that had been stored by the switched electrode but also the induced charge due to capacitive couplings to other adjacent charge collection electrodes.

The crosstalk problem is likely to become more important in the future, because techniques have been proposed in which charge collection electrodes overlap data lines, increasing capacitive coupling. Furthermore, as the cells of an array are reduced in size, each cell's total capacitance is likely to decrease, so that the error offset due to capacitive coupling to electrodes and to other components such as scan lines, thin film transistors (TFTs), and to metal vias will become proportionally larger.

The invention is based on the discovery of techniques that alleviate crosstalk by reducing capacitive coupling. The techniques provide an anticoupling layer between the data line and the charge collection electrodes. The anticoupling layer is structured to reduce capacitive coupling between the data line and each of the charge collection electrodes below a threshold level at which crosstalk is unacceptable.

In general, the level at which crosstalk becomes unacceptable is the level at which it begins to make noticeable changes in an image showing information obtained from a sensor array. The threshold level therefore depends on the number of distinct levels being sensed and on other parameters affecting perception or automatic image analysis, such as the spatial resolution of the sensor array and the pattern of the incident stimulation. If the pattern of incident stimulation has sufficient contrast, such as with a very bright region on a very dark background, crosstalk will also result in noticeable artifacts. These artifacts result when the stored charge on each electrode along a data line is modified by crosstalk through the data line, with electrodes in dark regions shifted toward brighter levels and with electrodes in bright regions shifted toward darker levels. Good image quality can usually be obtained if crosstalk is no greater than 2%.

One technique can be implemented in an improved sensor array of the type in which array circuitry includes data lines and, for each of the data lines, a number of cells, each with cell circuitry connected to the data line. Each cell's circuitry includes a sensing element and a switching element. The sensing element, which includes a charge collection electrode, receives a stimulus and provides an electric signal indicating a measure of the received stimulus. The switching element electrically connects the data line and a data lead of the charge collection electrode to provide the electric signal from the sensing element to the data line.

In this technique, the improvement in the sensor array includes, for each of a set of charge coupled electrodes, an overlap area in which the electrode overlaps a data line. The improvement also includes, in each overlap area, an anticoupling layer between the charge collection electrode and the data line it overlaps. The anticoupling layer is structured to reduce capacitive coupling between the charge collection electrodes and the data lines below a threshold level at which crosstalk is no greater than 2%.

In the improved sensor array, the charge collection electrodes can be formed in a first conductive layer, with the anticoupling layer over the data lines and the first conductive layer over the anticoupling layer. A charge collection electrode can overlap the entire width of a data line, or two adjacent charge collection electrodes can each partially overlap a data line between them. A second technique is based on the recognition that merely increasing thickness of a dielectric layer in a thin film structure ordinarily does not significantly reduce capacitive coupling. The second technique is further based on the discovery that capacitive coupling can nevertheless be reduced with an anticoupling layer with a lower dielectric constant.

The second technique can be implemented in an article of manufacture with a substrate on which array circuitry is formed as described above. The array circuitry includes an anticoupling layer between the charge collection electrodes and the data lines. The anticoupling layer is a dielectric layer with a dielectric constant less than 6.0 and a thickness greater than 1.5 $\mu$m. The dielectric constant is sufficiently low and the thickness sufficiently great that the anticoupling layer reduces capacitive coupling below the threshold level at which crosstalk is unacceptable.

The anticoupling layer can, for example, have a dielectric constant of 4.0. Or the anticoupling layer could be at least 3 $\mu$m thick with a dielectric constant no greater than 3.0. The anticoupling layer could even be 10 $\mu$m thick or more. The anticoupling layer could be a layer of benzocyclobutene, in which case its dielectric constant is approximately 2.7.

A third technique is based on the recognition that capacitive coupling in a sensor array can be reduced with an anticoupling layer that includes a fixed potential sublayer.

The third technique can be implemented in an article of manufacture with a substrate on which array circuitry is formed as described above. As in the second technique, the array circuitry includes an anticoupling layer between the charge collection electrodes and the data lines. The anticoupling layer includes a first insulating sublayer at its side toward the charge collection electrodes and a second insulating sublayer at its side toward the data lines. The anticoupling layer also includes a fixed potential sublayer between the first and second insulating sublayers. The article includes circuitry electrically connected to the fixed potential sublayer for holding it at a fixed potential. The fixed potential sublayer reduces capacitive coupling below the threshold level at which crosstalk is unacceptable.

The fixed potential sublayer can, for example, be a patterned layer that forms a grid. It can include aluminum or chromium.

In general, the invention could be implemented in any sensor array in which charge collection electrodes are in a different layer than the data lines, and is generally useful in arrays with vertically integrated sensor elements. Specifically, the invention is appropriate for sensor arrays in which charge collection electrodes are formed in a conductive layer over the data lines, with each charge collection electrode overlapping one or both of its adjacent data lines.

The techniques described above are advantageous because they prevent crosstalk between charge collection electrodes and data lines. In an array for sensing electromagnetic radiation, for example, this makes it possible to obtain more accurate gray scale resolution.

In addition, the techniques described above can also prevent capacitive coupling between charge collection electrodes and scan lines or gate electrodes connected to scan lines, which is advantageous because such coupling can produce a fairly significant offset signal. This offset signal equals CGDAVG, where CGD is the capacitance between gate and pixel and AVG is the gate voltage swing from off level to on level. In a vertically integrated sensor, the overlap of the charge collection electrode and scan lines can make the feedthrough charge comparable to the maximum signal charge. Readout electronics are conventionally modified to compensate this offset, but such modifications are not necessary if the above techniques are used.

The following description, the drawings, and the claims further set forth these and other aspects, objects, features, and advantages of the invention.

DETAILED DESCRIPTION

A. Conceptual Framework

Figure 1:
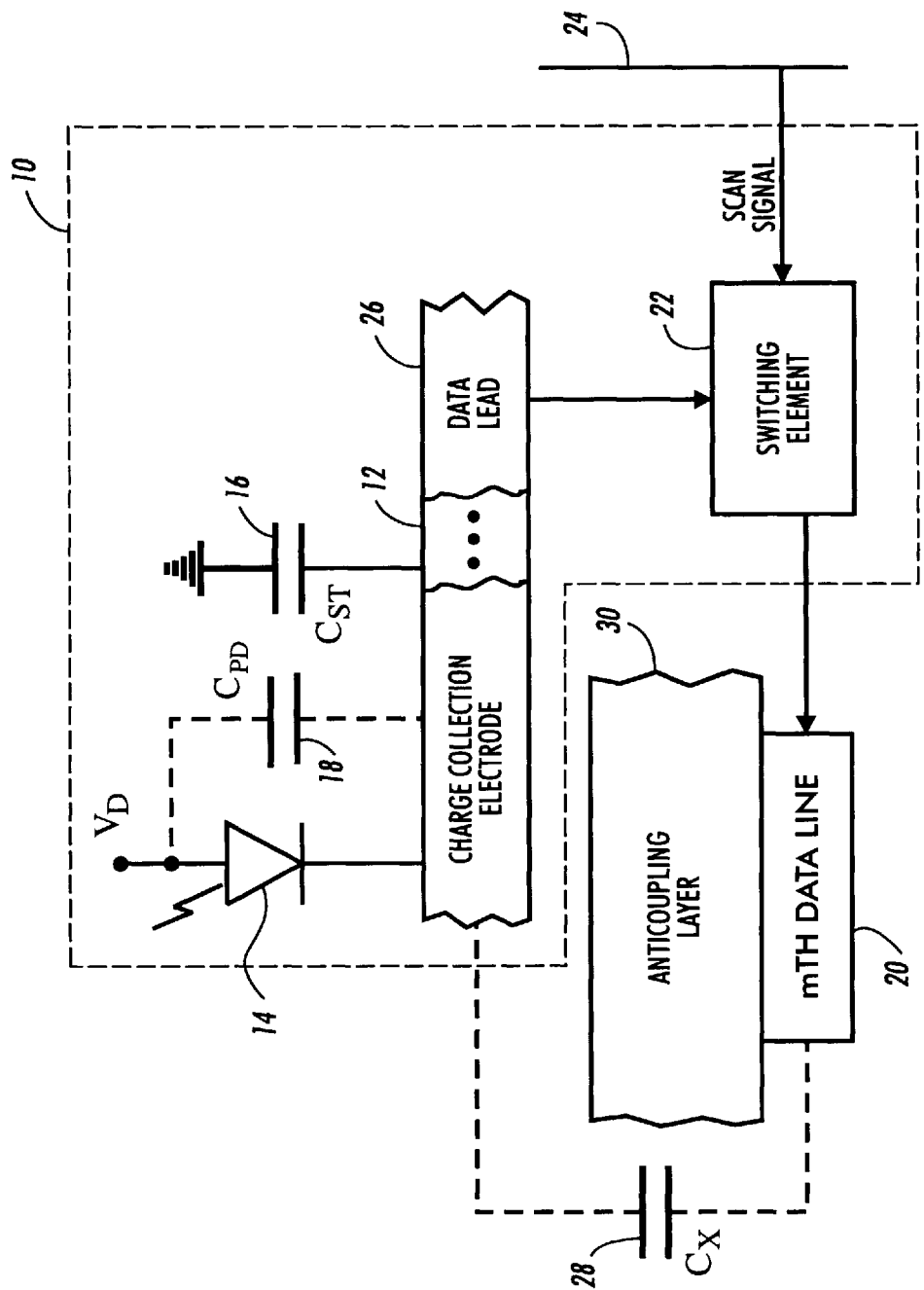
FIG. 1 is a schematic diagram showing how an anticoupling layer can reduce capacitive coupling between a charge collection electrode and a data line.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal provides information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other.

Two components are "electrically connected" when there is a combination of circuitry that can transfer electric signals from one to the other. Two components could be electrically connected even though they are not physically connected, such as through a capacitive coupling.

When circuitry transfers a signal from a first component to a second component, the first component "provides" the signal, and the second component "receives" the signal. A "signal interval" is a period of time during which a signal is provided or received.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

A layer of an electric structure is "structured for" performing a function if the layer has a thickness and composition such that it can perform the function. For example, characteristics of the material in a homogeneous layer and its thickness may enable it to perform the function. Or characteristics of sublayers in a layer may enable the layer to perform the function.

An operation "deposits" a layer by depositing material to form the layer, such as by physical or chemical vapor deposition.

A "patterned layer" is a layer that forms a pattern. For example, a patterned layer may be formed by removing part of a layer to form a pattern or by depositing a layer in a pattern.

To perform "lithography" or to "lithographically pattern" is to use a radiation source to transfer a mask pattern to a layer of radiation-sensitive material and then to develop the radiation-sensitive material to obtain a positive or negative copy of the mask pattern.

A "thin-film structure" is an electric structure that is formed at a surface of an insulating substrate. A thin-film structure could be formed, for example, by depositing and lithographically patterning films on the insulating substrate's surface.

An "integrated circuit" is a circuit formed at a substrate's surface by batch processes such as deposition, lithography, etching, oxidation, diffusion, implantation, annealing, and so forth.

In an electric structure at a surface, a part of a first layer "covers" or "has a shape that covers" or "is over" a part of a second layer if the part of the second layer is between the part of the first layer and the surface.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals, referred to as "data signals," that determine or indicate its state. Lines in the other direction may be "scan lines" through which a cell receives a signal, referred to as a "scan signal," enabling it to receive signals from or provide signals to its data line.

In an array of circuitry, "cell circuitry" is circuitry connected to a cell's scan line and data line.

A scan signal's "duty interval" is the signal interval during which a cell connected to receive the scan signal is enabled to receive or provide data signals through its data line.

A "channel" is a part of a component through which electric current can flow. A channel is "conductive" when the channel is in a state in which current can flow through it.

A "channel lead" is a lead that connects to a channel. A channel may, for example, extend between two channel leads.

A "switching element" is a component that includes a channel that extends between two channel leads and that can be controlled to switch between high impedance and low impedance.

A "sensing element" is a component that can receive a stimulus and can provide an electric signal indicating a measure of the received stimulus. The received stimulus could be electromagnetic radiation, pressure, temperature, chemicals, or any other stimulus that can be sensed and measured.

A sensing element may include a "charge collection electrode," meaning a conductive component that functions to collect charge resulting from the received stimulus.

A "conductive layer" is a layer formed of conductive material.

An "insulating layer" is a layer formed of a nonconductive material.

A part of a layer "has an edge" if another, complementary part of the layer has been removed by one or more processes, leaving the part of the layer. The edge is the boundary between part of a layer and its complementary part.

A part of a first layer "overlaps" a part of a second layer and vice versa if the part of the first layer is over and extends beyond an edge of the part of the second layer, but has an edge inside the edge of the part of the second layer. An "overlap area" is an area in which a part of one layer overlaps a part of another. If first and second overlapping parts are separated by a third layer, the part of the third layer that is "between" the overlapping parts is the part between the projection of the first part's overlapping edge onto the third layer and the projection of the second part's overlapping edge onto the third layer.

A "capacitive element" or "capacitor" is a component that stores a voltage level by storing charge. A capacitive element may include two conductive components, called "electrodes," separated by an insulating layer. A "dielectric layer" is an insulating layer that separates the electrodes of a capacitive element.

The "dielectric constant" of a dielectric layer is the ratio of the capacitance of a capacitor that includes the dielectric layer to that of an otherwise identical capacitor that includes a vacuum dielectric.

A "capacitively coupled signal" is a signal that a component receives capacitively rather than through other events, such as flow of direct current to or from the component.

"Capacitive coupling" occurs between two components when one of the components receives a capacitively coupled signal from the other.

A component functions to "reduce capacitive coupling" if the component has a characteristic such that capacitive coupling is lower than it would be if the component did not have the characteristic. For example, the component reduces capacitive coupling because of its structure, the component is "structured to reduce capacitive coupling."

An "anticoupling layer" is a layer that functions to reduce capacitive coupling between two components.

In a sensor array, a level of capacitive coupling "at which crosstalk is unacceptable" is a level of capacitive coupling at which at which crosstalk begins to make noticeable changes in an image showing information obtained by the array. The threshold level therefore depends on the number of distinct stimulus levels being sensed and on other parameters affecting perception or automatic image analysis, such as the spatial resolution of the sensor array and the pattern of incident stimulation. A "threshold level" of capacitive coupling, as used herein, means a level above which crosstalk is unacceptable.

Crosstalk is "no greater than 2%" when the ratio of induced charge resulting from capacitive coupling to stored charge resulting from the received stimulus does not exceed 2:100. Some publications in the field of x-ray imaging indicate that crosstalk that is no greater than 2% is acceptable.

An anticoupling layer that is a dielectric layer between two components has "sufficiently low dielectric constant and ... sufficient thickness" to reduce capacitive coupling below a threshold level if capacitive coupling between the two components under normal operating conditions remains below a level at which crosstalk is unacceptable, and would only reach an unacceptable level if its dielectric constant were increased or its thickness were decreased.

A component is "at a fixed potential" if, during operation of the circuit, it is connected through a combination of leads and lines to a low impedance component, referred to herein as "fixed potential circuitry," that is treated as being at a fixed potential. For example, an integrated circuit typically has an external ground connection that is treated as zero potential; a component that is connected by a combination of leads and lines to the external ground connection is at a fixed potential and, more specifically, is at ground potential.

A "fixed potential sublayer" is a conductive sublayer in an electric structure, where, for proper functioning of the structure, the sublayer must be at a fixed potential.

A fixed potential sublayer that is patterned or another patterned layer forms a "grid" if it includes a crisscross of line- or bar-like features.

B. General Features

Figure 2:
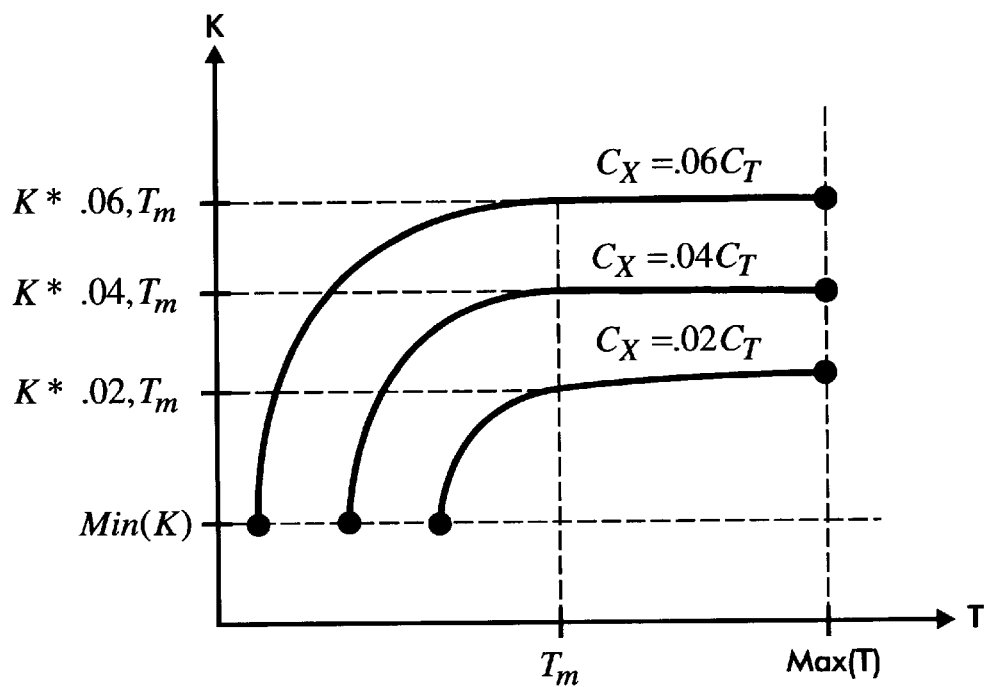
FIG. 2 is a graph illustrating a relationship among dielectric constant, thickness, and threshold levels above which capacitive coupling results in unacceptable crosstalk.
Figure 3:
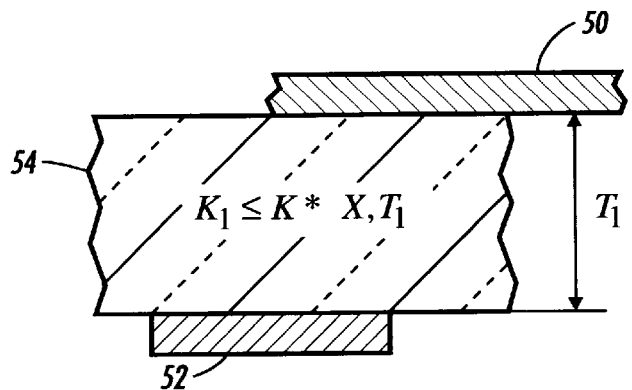
FIG. 3 is a cross section showing an anticoupling layer that reduces capacitive coupling because its dielectric constant is sufficiently low and it has sufficient thickness to reduce capacitive coupling below a threshold level.
Figure 4:
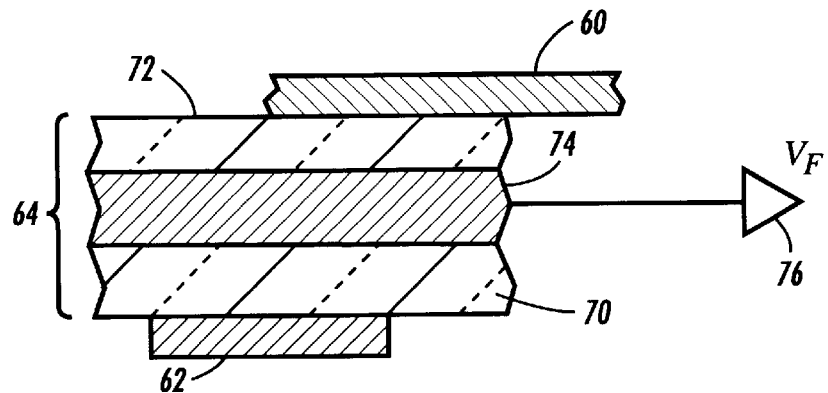
FIG. 4 is a cross section showing an anticoupling layer that includes a fixed potential sublayer which reduces capacitive coupling below a threshold level.

FIGS. 1–4 show general features of the invention. FIG. 1 shows how an anticoupling layer can reduce capacitive coupling between a charge collection electrode and a data line. FIG. 2 shows a relationship among dielectric constant, thickness, and threshold levels above which capacitive coupling results in unacceptable crosstalk. FIG. 3 shows an anticoupling layer that reduces capacitive coupling below the threshold because its dielectric constant is sufficiently low and it is sufficiently thick. FIG. 4 shows an anticoupling layer with a fixed potential sublayer that reduces capacitive coupling below the threshold.

Cell circuitry 10 in FIG. 1 includes charge collection electrode 12, part of a sensing element. Although the sensing element could receive any measurable physical stimulus, FIG. 1 illustrates the specific example of a sensing element that receives electromagnetic radiation and provides an electric signal indicating a measure of received radiation. More specifically, the sensing element in FIG. 1 illustratively includes photodiode 14 for receiving light, but photodiode 14 is merely a representative example of the wide variety of components that can receive electromagnetic radiation and other incident stimuli.

Due to bias voltage $V_D$, when photodiode 14 receives radiation at the appropriate frequency, a current flows, storing charge on charge collection electrode 12. If necessary, the sensing element may include storage capacitor 16, which has a capacitance of $C_{ST}$. As shown, charge collection electrode 12 can be one of the electrodes of storage capacitor 16 or can be electrically connected to one of the storage capacitor electrodes, the other electrode conventionally being at a fixed potential. Photodiode 14 also has its own capacitance 18, with a capacitance of $C_{PD}$; if $C_{PD}$ provides enough charge storage to meet operating requirements, storage capacitor 16 may be omitted because it is unnecessary.

FIG. 1 also shows mth data line 20, one data line in an array with M data lines, where M is two or more. Cell circuitry 10 also includes switching element 22, which responds to a signal from scan line 24 by electrically connecting data line 20 and data lead 26 of charge collection electrode 12 so that charge from charge collection electrode 12 is provided to data line 20.

As shown in FIG. 1, coupling capacitance 28, with a capacitance of $C_X$, occurs between charge collection electrode 12 and data line 20. If charge collection electrode 12 overlaps data line 20, $C_X$ increases dramatically from the fringing capacitance that would occur if charge collection electrode 12 and data line 20 were coplanar. Specifically, $C_X = C_{INS} w l$, where $C_{INS}$ is the capacitance per unit area of an insulating layer between charge collection electrode 12 and data line 20; w is the width of the overlap, which may be equal to the width of data line 20; and l is the length of the overlap, which may be the length of the cell. In contrast, for square cells with length l, $C_{PD} = C_S l^2$, where $C_S$ is the capacitance per unit area of the sensor layer, which occupies approximately the entire cell area, $l^2$.

Crosstalk occurs when induced signals generated at the cells along data line 20 together cause data line voltage to change from the direct signal expected when a duty interval occurs in the scan signal on scan line 24. During the duty interval, switching element 22, which may be a transistor, is conductive, so that a direct signal is provided from charge collection electrode 12 to data line 20, but induced signals from capacitance 28 and similar induced signals from coupling capacitances of other cells along data line 20 are also present on data line 20, producing an error offset.

Conventionally, readout circuitry resets data line 20 to ground between each readout cycle, nulling out the effect of capacitive coupling. This may be done by connecting data line 20 to a fixed potential. If this is done, the maximum crosstalk signal charge for a particular data line is $Q_X = N_{GATE} I_{MAX} \tau_{GATE} (C_X/C_T)$, where $N_{GATE}$ is the number of scan lines; $I_{MAX}$ is the current flowing to each charge collection electrode at maximum stimulation, such as photocurrent under full illumination; $\tau_{GATE}$ is the time between readout cycles; and $C_T$ is the total capacitance of the charge collection electrode other than $C_X$ and can be approximated as the sum of $C_{ST}$ and $C_{PD}$. In comparison, during continuous maximum stimulation, the direct signal charge stored by each charge collection electrode $Q_T = I_{MAX} \tau_{FRAME}$, where the frame integration time $\tau_{FRAME}$ also equals $N_{GATE} \tau_{GATE}$. Therefore, the maximum crosstalk error offset is $Q_X/Q_T$, which equals $C_X/C_T$ in the case of continuous maximum stimulation. More generally, $Q_X = E\{\int I_{Tn}(t) \, dt \, (C_{Xn}/C_{Tn})\}$, where the summation is taken from n=1 through $N_{GATE}$, where the integral is taken over the interval from 0 through $\tau_{GATE}$, and where $I_{Tn}$ is the current flowing into the nth charge collection electrode associated with the particular data line and $C_{Xn}$ and $C_{Tn}$ are respectively the crosstalk capacitance and the other capacitance for the nth charge collection electrode.

An example helps to illustrate the seriousness of the crosstalk problem: Assume a 400 spots per inch (spi) sensor array has square cells with a length of 63.5 $\mu$m, data line width of 6 $\mu$m overlapped 1 $\mu$m by each adjacent charge collection electrode, sensor layer thickness of 1.3 $\mu$m, and SiO$_X$N$_Y$ insulating layer with dielectric constant K=6 and thickness of 0.6 μm. C$_X$=0.015 pF and C$_T$=0.33 pF, yielding maximum crosstalk error offset of 0.015/0.33=4.5%, which is typically not acceptable.

The crosstalk problem can also be serious even without overlap if each cell is sufficiently small that C$_T$ becomes very small, making C$_X$ more significant. It can be alleviated to some extent by adding a storage capacitor, but this adds to process complexity, may affect yield, and slows readout.

Anticoupling layer 30 between electrode 12 and data line 20 is structured, however, to reduce the capacitive coupling due to C$_X$ below a threshold level at which crosstalk would be unacceptable. For example, anticoupling layer 30 may reduce capacitive coupling to be no greater than 2%.

FIG. 2 illustrates a relation that has been observed between dielectric constant K, thickness T, and threshold levels above which capacitive coupling results in unacceptable crosstalk, in the case of a uniform dielectric layer. Each threshold is a ratio between C$_X$ and C$_T$, with FIG. 2 showing representative curves for 2%, 4%, and 6% thresholds that may be obtained for currently available thin film structures. As shown, each threshold follows a characteristic curve between two boundaries—in the K-T region above and to the left of the threshold's curve, crosstalk exceeds the threshold, while in the K-T region below and to the right, crosstalk is below the threshold.

One boundary is defined by the maximum feasible thickness of the dielectric layer Max(T), the other by the minimum available dielectric constant of a material that can be used to produce the dielectric layer Min(K). At Max(T), crosstalk can only be reduced by reducing K. At Min(K), on the other hand, crosstalk can only be reduced by increasing T.

Between the boundary conditions, the threshold follows a curve that depends on T and can be inferred from C$_X$≈Kε$_0$ (l+3T)(w+3T)/T, a relationship that closely approximates C$_X$ for thin film structures. When overlap is large in relation to T, so that the length l and width w of the overlap are much greater than 3T, C$_X$ varies inversely as T; as overlap decreases in relation to T, there may be an intermediate region in which length of overlap is much greater than 3T but width is much smaller than 3T, so that C$_X$ does not vary with T; and when overlap is small in relation to T, fringing capacitance dominates and C$_X$ varies proportionally with T.

FIG. 2 also illustrates K*, a function of crosstalk X and thickness T. For the representative thickness T$_m$ and for the values of X=0.02, 0.04, and 0.06, K* has the three values shown on the K-axis. K*(0.02, T$_m$) is of particular interest because it is just above the "shoulder" of the 2% crosstalk curve, at a point where small variations in T do not appreciably change K* but just above a region in which small variations in T significantly change K*. The actual variations in T that occur depend, of course, on the process used to produce the dielectric layer, but FIG. 2 illustrates how T can be chosen to have a relatively low value, but just high enough that the variations will not significantly reduce K*, which would have the effect of increasing crosstalk toward unacceptable levels.

FIG. 3 illustrates one way an anticoupling layer could be structured to reduce capacitive coupling. Charge collection electrode 50 is in a layer that overlaps data line 52, with dielectric layer 54 between them having a thickness T$_1$ and a dielectric constant K$_1$ that is no greater than K*(X, T$_1$) for the array, so that crosstalk is no greater than the threshold level X, where X=C$_X$/C$_T$. As a result of its structure, and specifically the combination of its dielectric constant and its thickness, dielectric layer 54 acts as an anticoupling layer, reducing capacitive coupling between electrode 50 and data line 52 below the threshold level for crosstalk.

As discussed below, the technique of FIG. 3 could be implemented with a 3 μm dielectric layer that has K=2.6. Applying the calculations discussed above in relation to FIG. 1 but with K$_1$=2.6 and T$_1$=3 μm, C$_X$=0.006 pF, while C$_T$=0.33 pF, so that X=1.5%, a level of crosstalk that is generally considered acceptable. FIG. 4 illustrates another way an anticoupling layer could be structured to reduce capacitive coupling. Charge collection electrode 60 is in a layer that overlaps data line 62, with anticoupling layer 64 between them including sublayers. First insulating sublayer 70 is on the side of anticoupling layer 64 toward data line 62; second insulating sublayer 72 is on the side of anticoupling layer 64 toward charge collection electrode 60; and fixed potential sublayer 74 of conductive material is between first insulating sublayer 70 and second insulating layer 72. FIG. 4 also shows fixed potential circuitry 76 electrically connected to fixed potential sublayer 74 to hold it at a fixed potential V$_F$, which could, for example, be ground.

C. Implementations

The general features described above could be implemented in numerous ways. The implementations described below provide active matrix sensor arrays with TFTs as switching elements.

C.1. Dielectric Layer

Figure 5:
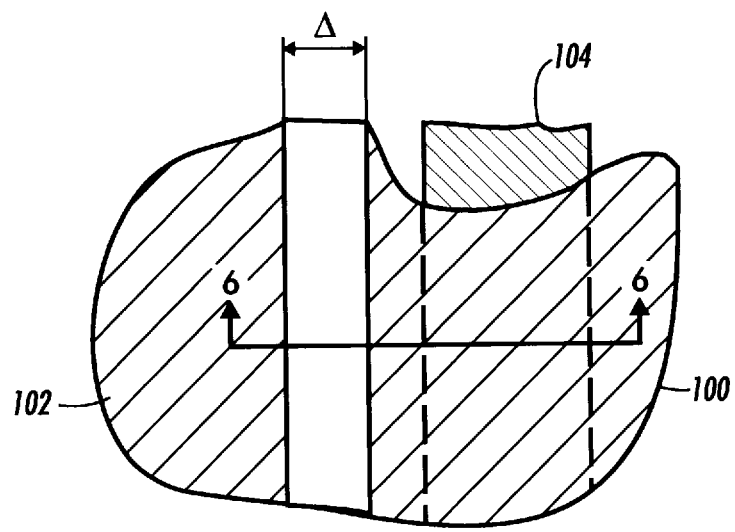
FIG. 5 is a schematic layout diagram showing a sensor array with a charge collection electrode over a data line.
Figure 6:
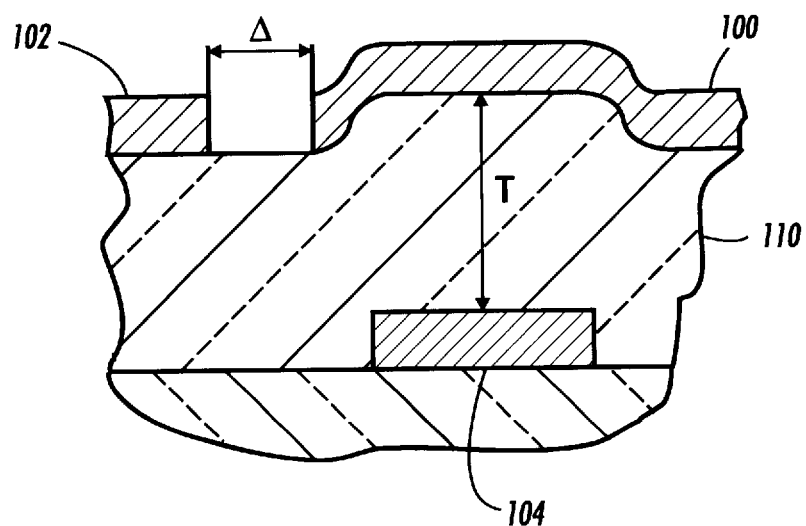
FIG. 6 is a schematic cross section of the sensor array of FIG. 5, taken along line 6—6.
Figure 7:
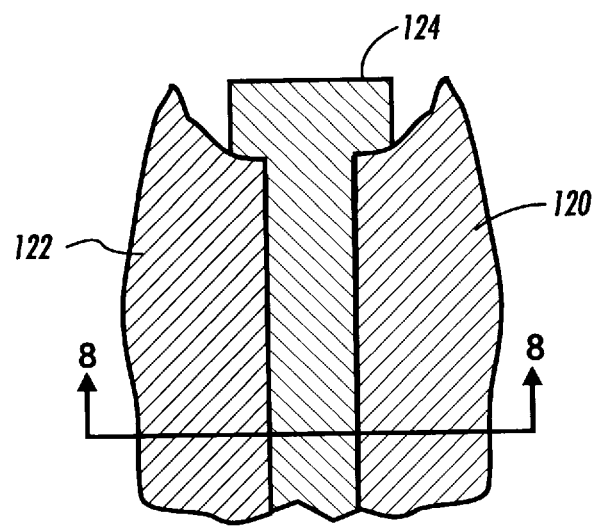
FIG. 7 is a schematic layout diagram showing a sensor array with adjacent charge collection electrodes each partially overlapping a data line.
Figure 8:
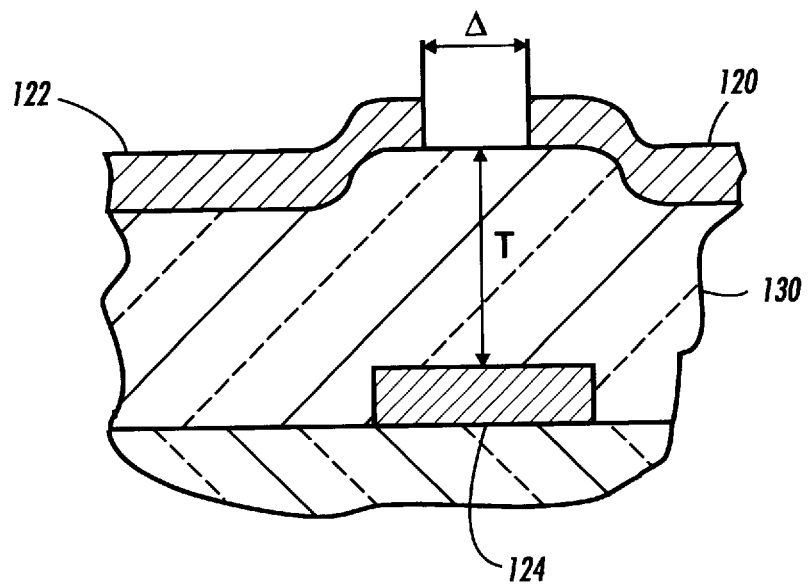
FIG. 8 is a schematic cross section of the sensor array of FIG. 5, taken along line 8—8.
Figure 9:
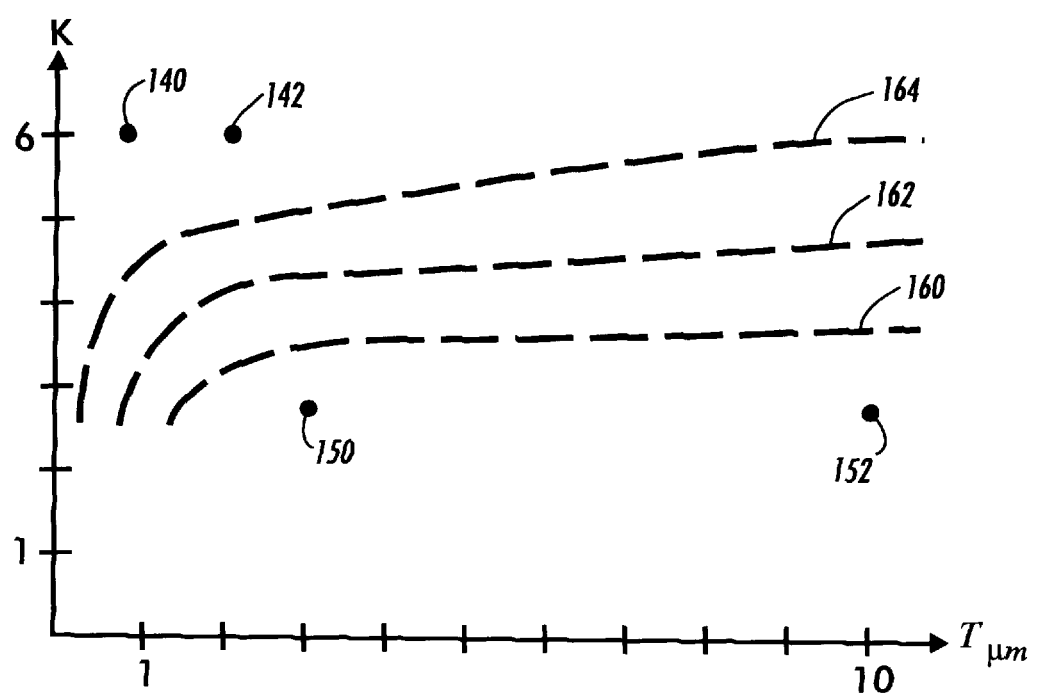
FIG. 9 is a graph illustrating relationships between dielectric constants and thicknesses for several implementations of sensor arrays.

FIG. 5 shows a partial layout of a sensor array in which a charge collection electrode overlaps an adjacent data line. FIG. 6 shows a cross section of the array of FIG. 5 along the line 6—6. FIG. 7 shows a partial layout of a sensor array in which adjacent charge collection electrodes both overlap a data line. FIG. 8 shows a cross section of the array of FIG. 7 along the line 8—8. FIG. 9 shows the relationships between dielectric constants and thicknesses for several implementations.

FIG. 5 shows charge collection electrodes 100 and 102, separated by a minimum electrode separation A. As shown in the cutaway, electrode 100 completely overlaps data line 104.

As shown in FIG. 6, data line 104 is formed in a lower conductive layer over lower layers or a substrate. Over it is dielectric layer 110, with a thickness of T. Electrodes 100 and 102 are formed in a patterned upper conductive layer over dielectric layer 110.

FIG. 7 shows charge collection electrodes 120 and 122, also separated by the minimum electrode separation A, but both partially overlapping data line 124.

As shown in FIG. 8, data line 124 is formed in a lower conductive layer. Over it is dielectric layer 130, with a thickness of T. Electrodes 120 and 122 are formed in a patterned upper conductive layer over dielectric layer 130.

The layers shown in FIGS. 5–8 could be produced in a number of ways, including the techniques shown and described in copending, coassigned U.S. patent application Ser, Nos. 08/483,406, entitled "Improved Solid State Sensor" ("the Solid State Sensor Application" ) and 08/474,845, entitled "Array Circuitry with Conductive Lines, Contact Leads, and Storage Capacitor Electrode All Formed in Layer that Includes Highly Conductive Metal" ("the Single Layer Application"), both incorporated herein by reference.

The Solid State Sensor Application describes techniques in which a photodetection device such as an image sensing array includes a photodiode formed over a transistor. As shown and described in relation to FIGS. 1–4, a silicon oxynitride ($SiO_xN_y$) layer about 0.5 μm to about 2.0 μm is formed over a TFT's source electrode, which includes a TiW barrier layer and an Al layer. Over the $SiO_xN_y$ layer is formed an $n^+$ doped layer, the lower charge collection electrode of a photodiode, and the photodiode is separated from adjacent photodiodes by a notch. As shown and described in relation to FIGS. 5–8, an optional metal layer of Cr or TiW can be formed between the $SiO_xN_y$ layer and the $n^+$ doped layer, and the notch can also pass through the metal layer. The metal layer may be added to increase conductivity and therefore the maximum readout speed of photocharges from the photodiode.

The Single Layer Application describes techniques in which an array has a conductive element over a layer of highly conductive metal such as aluminum or an alloy, separated by an insulating layer of $SiO_xN_y$ or another appropriate material. The highly conductive layer includes a data line, leads of a TFT, and a storage capacitor electrode. In an x-ray sensor, the conductive element can serve as a charge collection electrode. As shown and described in relation to FIG. 3, the conductive element can overlap one adjacent scan line, align with but not overlap adjacent data lines, and be spaced from another adjacent scan line. As described in relation to FIG. 4, the data lines can be formed in a layer with a sublayer of aluminum sandwiched between upper and lower sublayers of TiW, and the conductive element can be in a layer of ITO, with a layer of $SiO_xN_y$ between them sufficiently thick to prevent the conductive element from significantly slowing propagation of signals on the scan line it overlaps. As mentioned in relation to FIG. 6, the $SiO_xN_y$ layer can be deposited to a thickness of 6000 angstroms (6 μm) or thicker if necessary to reduce coupling. As shown and described in relation to FIG. 7, the conductive element could also be offset from data lines and leads to prevent crosstalk if the thickness of the passivation layer is inadequate to prevent capacitive coupling.

FIG. 9 shows a graph similar to that of FIG. 2, but with information based on implementations of arrays like those in the Solid State Sensor Application and the Single Layer Application. In general, current implementations have 6 μm wide data lines, with each adjacent charge collection electrode overlapping by 1 μm and with 4 μm separations between electrodes. Each pixel is 63.5 μm square.

Point 140 represents a conventional dielectric layer of silicon oxynitride ($SiO_xN_y$) at a thickness of 0.6 μm and a dielectric constant of 6. Point 142 represents a dielectric layer of $SiO_xN_y$ at a thickness of 2 μm, somewhat thicker than the layer of point 140 and difficult to fabricate. As discussed in relation to FIG. 2, it is unlikely that crosstalk can be significantly reduced merely with a thicker dielectric layer.

Point 150 represents a dielectric layer of benzocyclobutene, marketed by Dow Chemical under the trademark BCB, which can be spun on at a thickness of 3 μm and possibly even less and which has a dielectric constant of approximately 2.6. Tests are currently in process to implement 3 μm BCB layers, but calculations indicate that such layers may result in crosstalk of approximately 1.5%, which would be acceptable. Point 152 represents a spun on dielectric layer of BCB with a thickness of 10 μm, which has been successfully fabricated. Tests of 10 μm BCB layers indicate that crosstalk is significantly reduced.

The BCB material is regarded as especially advantageous in this application because it can be spin coated to a desired thickness and has a very low dielectric constant. It does not require the costly deposition time and accompanying use of equipment necessary for a thick layer of $SiO_xN_y$. It is described, for example, in Fuhrmann, J., Rau, L., Kaefer, S., Lueder, E., and Radler, M., "Improvement of MIM-Addressed Projection Light Valves Using Advanced Electronic Resins," *SID 96 Digest,* May 1996, pp. 603–606.

Various other materials could be used to form an appropriate dielectric layer. For example, other low stress dielectrics similar to $SiO_xN_y$ could be applied by PECVD to an appropriate thickness, such as silicon oxide, which has a dielectric constant of approximately 4. Or a polymer film such as polyimide could be formed to an appropriate thickness by a coating process.

FIG. 9 shows threshold curves 160, 162, and 164, simply to illustrate how the threshold curve for the level of crosstalk sought may affect the choice of dielectric constant and thickness. If threshold curve 160 applies, the choice of dielectric constant is limited to very low values, precluding the use of silicon oxide. If threshold curve 162 applies, it may be possible to use silicon oxide, because, at sufficient thicknesses, crosstalk may be acceptable with K=4. If threshold curve 164 applies, it may even be possible to use some types of $SiO_xN_y$ that have dielectric constants below 6. But the difficulties in fabricating thick layers of $SiO_xN_y$ may make it difficult to use $SiO_xN_y$.

C.2. Fixed Potential Sublayer

Figure 10:
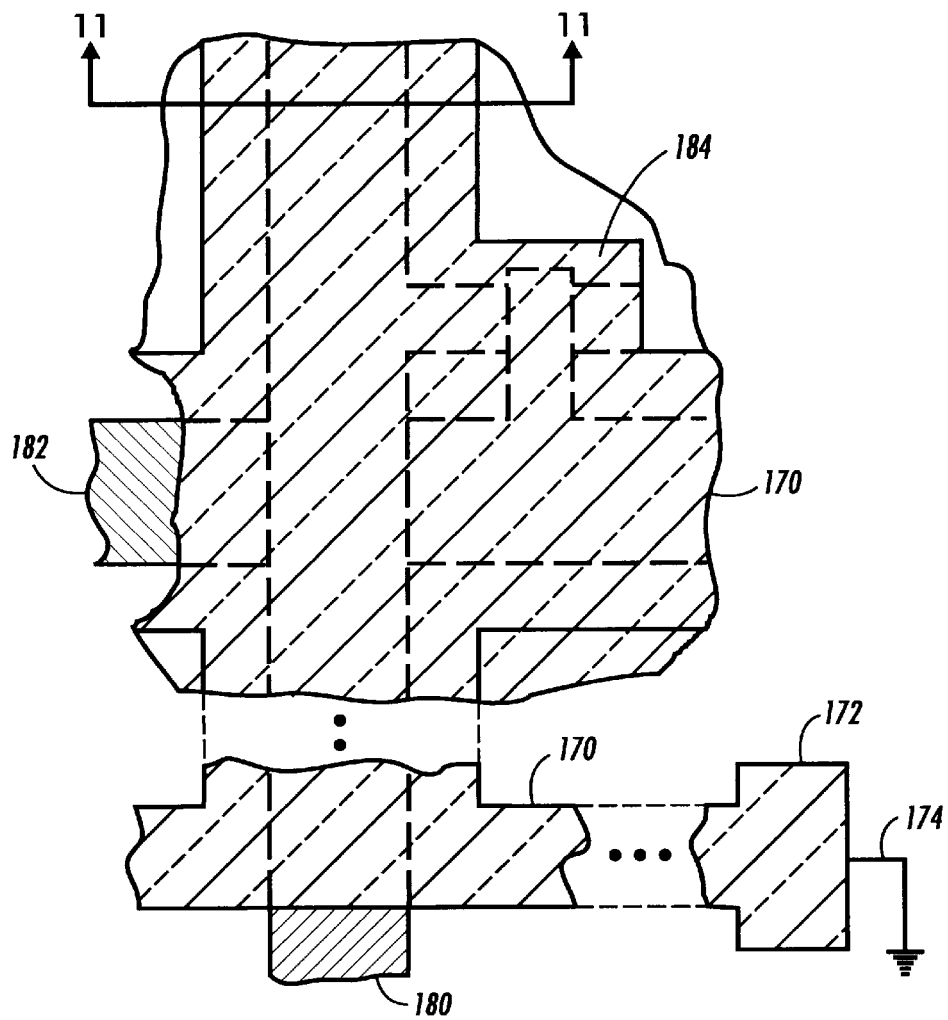
FIG. 10 is a schematic layout diagram showing a sensor array with a fixed potential grid to reduce capacitive coupling between charge collection electrodes and data lines.
Figure 11:
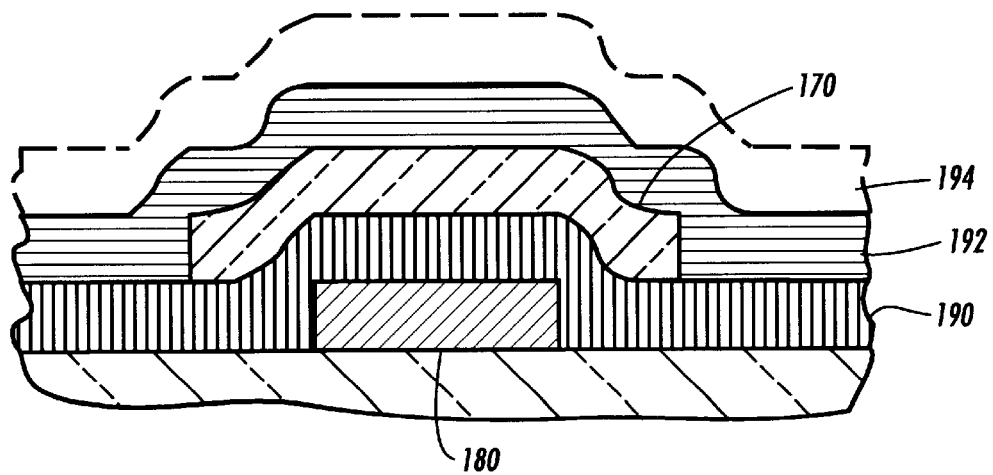
FIG. 11 is a cross section of the sensor array of FIG. 10, taken along line 11—11.

FIG. 10 shows a partial layout of a sensor array in which an anticoupling layer includes a fixed potential sublayer. FIG. 11 shows a cross section of the array of FIG. 10 along the line 11—11.

FIG. 10 shows fixed potential grid 170, a patterned conductive sublayer between data lines and charge collection electrodes in a sensor array. As shown, grid 170 can extend to pad 172, at which it can be electrically connected to a fixed potential by circuitry 174. The connection can be made through a conventional electrical connection to ground or to another readily available low impedance fixed voltage source, such as the voltage on a backplane or a bias voltage. The electrical connection could be made directly through a pad at the periphery of the array as shown or, if the layer in which grid 170 is formed does not provide a satisfactory surface for making such a connection, by cutting an opening through lower layers so that grid 170 is electrically connected through metal-to-metal contact to a part of another metal layer that is in turn connected to a pad. The electrical connection from the pad could be provided through wires or other conductive elements.

Grid 170 covers data lines and scan lines in the sensor array, as illustrated by data line 180 and scan line 182, and also covers the TFT region of each cell's circuitry, as illustrated in transistor area 184 in which data line 180 and scan line 182 are connected to leads of a TFT.

As shown in FIG. 11, data line 180 is formed in a lower conductive layer over lower layers or a substrate. Over it is first dielectric sublayer 190, which could be $SiO_xN_y$. Over first dielectric sublayer 190, grid 170 is formed in a conductive sublayer which could include a conductive metal such as aluminum or chromium and which could alternatively be implemented as a multi-layered structure with alternating layers of refractory metals such as TiW or Ta and highly conductive metals such as Al or Cr. Over grid 170 is second dielectric sublayer 192, which could also be $SiO_xN_y$. FIG. 11 also shows in outline conductive layer 194, in which charge collection electrodes could be formed, with overlap as in one of FIGS. 5 and 7.

In addition to covering data lines and transistor areas, grid 170 could cover other areas of each cells circuitry. Grid 170 could not, however, extend into the region in which a lead from a charge collection electrode is electrically connected to a lead from the transistor or to another component such as a storage capacitor.

The implementation of FIGS. 10 and 11 may be advantageous over those of FIGS. 5–9 because it reduces the thickness of dielectric required to a range in which it is more easily deposited. In addition to reducing capacitive coupling between charge collection electrodes and data lines, grid 170 could function as a groundplane that reduces general electrical noise in the array.

On the other hand, the implementation of FIGS. 10 and 11 requires the deposition and patterning of an additional metal sublayer and the deposition of an additional dielectric sublayer.

C.3. Results

The implementation described above in relation to FIGS. 7 and 8 has been implemented experimentally in 512×640 x-ray sensor arrays with a pitch for each unit of cell circuitry of 63.5 $\mu$m, with data line widths of 6 $\mu$m, and with a spacing of approximately 4 $\mu$m between charge collection electrodes of adjacent cells.

As described in relation to FIG. 9, one experiment applied a 10 $\mu$m layer of BCB by spin coating, while another applied a 2 $\mu$m layer of $SiO_XN_Y$, which proved too thick for successful fabrication.

The experimental implementation with BCB was satisfactory with capacitive coupling reduced sufficiently that crosstalk was acceptable at 256 gray level resolution. The results matches predictions and suggest that a 3 $\mu$m layer of BCB will also be satisfactory. In addition, in both BCB implementations, selenium could easily be applied to produce an x-ray sensor array. The processes proved efficient and yielded well.

C.4. Variations

The implementations described above could be changed in many ways within the scope of the invention.

The implementation described above provides thin film circuitry on an insulating substrate, such as quartz or glass. The invention could be implemented with other types of circuitry on other types of substrates.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used. As mentioned above, other dielectric materials could be used besides $SiO_XN_Y$ and BCB, including $SiO_2$, $Si_3N_4$, a composite of $Si_3N_4$ and $SiO_2$, or an anodic oxide such as tantalum oxide or aluminum oxide, and the dielectric could be as thick as appropriate for the structure.

Various conductive materials could be used in the charge collection electrodes, with ITO being appropriate in an x-ray sensor array with a selenium coating because it provides a blocking contact that blocks injection of charge carriers into the selenium coating at high voltages; further, ITO is transparent, which may be useful in certain applications. Charge collection electrodes formed in Al and its alloys or a refractory metal, such as chromium, titanium, tungsten, or molybdenum, or their alloys, would prevent interaction with a semiconductor transducer layer. Further, a heavily doped conductive semiconductor layer would block charge injection into a semiconductor transducer layer.

Also, various conductive materials could be used in the scan lines and data lines and in a fixed potential sublayer, including but not limited to any appropriate metal or alloy such as Al with or without layers or barrier metals, ITO, MoTa, Cr, MoCr, Ta, Cu, Ti, TiN, W, hybrid multilayer stacks such as TiW/AlCu, and any appropriate organic conductive materials.

The implementations described above include layers in specific sequences, but the sequence of layers could be modified. For example, it may be possible for the charge collection electrodes to be under the data lines if radiation is received through the substrate. Similarly, any appropriate arrangement of components in each unit of cell circuitry could be used.

The implementations described above are appropriate for x-ray sensor arrays using selenium as a photoconductive material, but the invention could be used with other photoconductive materials and could be used in sensor arrays for radiation in other frequency bands or for stimuli other than electromagnetic radiation that can generate charge, such as chemicals, pressure, and temperature. The photoconductor could be amorphous silicon (a-Si), thallium bromide, lead iodide, or another appropriate material. For example, the invention could be used with an amorphous silicon photosensitive layer in a visible light sensor array as described in the Solid State Sensor Application.

The implementations of FIGS. 5–9 are described in relation to a single homogeneous dielectric layer between charge collection electrodes and data lines, but the invention could be implemented with a dielectric layer that includes two or more different dielectric sublayers that together reduce capacitive coupling.

The implementation of FIGS. 10 and 11 is described in relation to a single fixed potential sublayer between first and second insulating sublayers, but the invention could be implemented with multiple fixed potential sublayers and with additional insulating sublayers. Further, the implementation of FIGS. 10 and 11 is described in relation to a specific fixed potential sublayer layout in which parts of the sublayer are interconnected to form a mesh, but the invention could be implemented with a wide variety of layouts, including layouts in which the sublayer's parts are not interconnected, but have separate electrical connections to a fixed potential.

The above implementations are suitable for sensor arrays in which stored charge is transferred from a charge collection electrode to a data line in response to a duty interval in a scan signal and then, after the duty interval, the charge on the data line is sensed by readout circuitry electrically connected to the data line. Examples of such readout techniques that reduce crosstalk are described in copending, coassigned U.S. patent application Ser. No. 08/BBB,BBB (Attorney Docket No. D/96303Q), entitled "Sensor Array Data Line Readout with Reduced Crosstalk," incorporated herein by reference. The invention could, however, be implemented with other read out techniques.

The above implementations employ TFTs as switching elements, but the invention could be implemented with any appropriate switching elements.

In the above implementations, charge collection electrodes overlap data lines, but the invention could be implemented with charge collection electrodes that do not overlap data lines.

D. Application

The invention could be applied in many ways, including arrays for sensors of various bands of radiation, including x-rays as in the Single Layer Application and light in the visible or near-visible range as in the Solid State Sensor Application.

A small, high resolution x-ray sensor array could be used for mammographic imaging, while a larger, low resolution x-ray sensor array could be used as a film replacement in other diagnostic radiology applications.

A large, high resolution photosensor array could be used in a document reader.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. An improved sensor array of the type having array circuitry that includes M data lines, where M is two or more, and, for each of the M data lines, a number of cells, each with cell circuitry connected to the data line; the cell circuitry of each cell along the mth data line including:
   a sensing element for receiving a stimulus and for providing an electric signal indicating a measure of the received stimulus; the sensing element including a charge collection electrode; and
   a switching element for electrically connecting the mth data line and a data lead of the charge collection electrode to provide the electric signal from the sensing element to the mth data line;
the improvement comprising:
   each of a set of the charge collection electrodes having an overlap area in which it overlaps a data line; and
   in each of the overlap areas, an anticoupling layer between the charge collection electrode and the data line it overlaps; the anticoupling layer being structured to reduce capacitive coupling between the charge collection electrodes and the data lines below a threshold level at which crosstalk is no greater than 2%.

2. The improved sensor array of claim 1 in which the anticoupling layer is a dielectric layer with a sufficiently low dielectric constant and with sufficient thickness to reduce capacitive coupling below the threshold level.

3. The improved sensor array of claim 1 in which the anticoupling layer has a first side toward the data line and a second side toward the charge collection electrode; the anticoupling layer comprising:
   a first insulating sublayer at the first side;
   a second insulating sublayer at the second side; and
   a fixed potential sublayer of conductive material between the first and second insulating sublayers;
the improvement further comprising:
   fixed potential circuitry electrically connected to the fixed potential sublayer for holding the fixed potential sublayer at a fixed potential.

4. The improved sensor array of claim 1 in which the anticoupling layer is over the data lines and the charge collection electrodes are over the anticoupling layer.

5. The improved sensor array of claim 1 in which a charge collection electrode that is in the set overlaps the entire width of a data line.

6. The improved sensor array of claim 1 in which two adjacent charge collection electrodes that are both in the set each partially overlap a data line between them.

7. An article of manufacture comprising:
   a substrate with a surface at which circuitry can be formed;
   array circuitry formed at the surface of the substrate, the array circuitry comprising:
   M data lines, where M is two or more;
   for each of the M data lines, a number of cells, each with cell circuitry connected to the data line; the cell circuitry of each cell along the nth data line including:
      a sensing element for receiving a stimulus and for providing an electric signal indicating a measure of the received stimulus; the sensing element including a charge collection electrode; and
      a switching element for electrically connecting the mth data line and a data lead of the charge collection electrode to provide the electric signal from the sensing element to the mth data line; and
   an anticoupling layer between the charge collection electrodes and the data lines; the anticoupling layer being a dielectric layer with a dielectric constant less than 6.0 and a thickness greater than 1.5 $\mu$m, the dielectric constant being sufficiently low and the thickness sufficiently great that the anticoupling layer reduces capacitive coupling between the charge collection electrodes and the data lines below a threshold level at which crosstalk is unacceptable.

8. The improved sensor array of claim 7 in which the dielectric constant is no greater than 4.0.

9. The improved sensor array of claim 8 in which the anticoupling layer is at least 3 $\mu$m thick and the dielectric constant is no greater than 3.0.

10. The improved sensor array of claim 9 in which the anticoupling layer is at least 10 $\mu$m thick.

11. The improved sensor array of claim 7 in which the anticoupling layer is a layer of benzocyclobutene.

12. The improved sensor array of claim 11 in which the dielectric constant is approximately 2.7.

13. An article of manufacture comprising:
   a substrate with a surface at which circuitry can be formed;
   array circuitry formed at the surface of the substrate, the array circuitry comprising:
   M data lines, where M is two or more;
   for each of the M data lines, a number of cells, each with cell circuitry connected to the data line; the cell circuitry of each cell along the mth data line including:
      a sensing element for receiving a stimulus and for providing an electric signal indicating a measure of the received stimulus; the sensing element including a charge collection electrode; and
      a switching element for electrically connecting the mth data line and a data lead of the charge collection electrode to provide the electric signal from the sensing element to the mth data line;
      an anticoupling layer having a first side toward the charge collection electrodes and a second side toward the data lines; the anticoupling layer being between the charge collection electrodes and data lines; the anticoupling layer comprising:

a first insulating sublayer at the first side of the anticoupling layer;

a second insulating sublayer at the second side of the anticoupling layer; and a fixed potential sublayer of conductive material between the first and second insulating sublayers; and fixed potential circuitry electrically connected to the fixed potential sublayer for holding the fixed potential sublayer at a fixed potential;

the fixed potential sublayer reducing capacitive coupling between the charge collection electrodes and the data lines below a threshold level at which crosstalk is unacceptable.

14. The article of claim 13 in which the charge collection electrodes are in a first conductive layer; the first conductive layer being over the anticoupling layer; the anticoupling layer being over the data lines.

15. The article of claim 13 in which the fixed potential sublayer is a patterned layer forming a grid.

16. The article of claim 13 in which the fixed potential sublayer comprises aluminum.

17. The article of claim 13 in which the fixed potential sublayer comprises chromium.

* * * * *